(12) United States Patent
Tsukahara (10) Patent No.: US 6,369,633 B1
(45) Date of Patent: Apr. 9, 2002

(54) QUADRATURE SIGNAL GENERATION SYSTEM (75) Inventor: Tsuneo Tsukahara, Kanagawa (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 09/619,637

(22) Filed: Jul. 19, 2000

(30) Foreign Application Priority Data

Jul. 27, 1999  (JP) ............................................ 11-211875

(51) Int. Cl.[7] .......................... H03H 11/16; H03K 3/00
(52) U.S. Cl. ...................................... 327/254; 327/355
(58) Field of Search ................................ 327/346, 347, 327/349, 350, 351, 352, 355, 357, 361, 253, 238, 254, 255, 258

(56) References Cited

U.S. PATENT DOCUMENTS

| | | | | |
|---|---|---|---|---|
| 4,379,266 A | * | 4/1983 | Rubin ........................ 329/104 |
| 4,431,969 A | * | 2/1984 | Summers et al. ........... 328/155 |
| 5,063,446 A | * | 11/1991 | Gibson ....................... 358/142 |
| 5,121,057 A | * | 6/1992 | Huber et al. ................ 324/212 |
| 5,412,351 A | | 5/1995 | Nystrom et al. ............ 332/103 |
| 6,031,865 A | * | 2/2000 | Kelton et al. ............... 375/206 |
| 6,151,313 A | * | 11/2000 | Abramson ................... 370/342 |
| 6,181,181 B1 | * | 1/2001 | Tsukahara et al. .......... 327/233 |

OTHER PUBLICATIONS

Tsukahara et al., ISSCC 2000 Session 23 Wireless Building Blocks Paper WP23.5, Feb. 9, 2000, pp. 384–385, p. 471, pp. 310–311, pp. 501.

* cited by examiner

Primary Examiner—My-Trang Nu Ton
(74) Attorney, Agent, or Firm—Arent Fox Kintner Plotkin & Kahn, PLLC

(57) ABSTRACT

A quadrature signal generation system which has a pair of input terminals for receiving a first A.C. signal and a second A.C. signal. The first A.C. signal and the second A.C. signal have a predetermined frequency and a phase relation of approximate 90° with each other. The system also has a multiplier circuit for providing a product of the first A.C. signal and the second A.C. signal, resulting in a third A.C. signal. Furthermore, the system has a square-difference circuit for providing a difference of a square of the first A.C. signal and a square of the second A.C. signal, the difference being a fourth A.C. signal. The frequency of the third A.C. signal, and the fourth A.C. signal are equal to twice the frequency of the first A.C. signal and the second A.C. signal, and the third A.C. signal and the fourth A.C. signal have a fine phase relation of 90° with each other.

9 Claims, 11 Drawing Sheets

$V_{OUT} \propto V_1^2 - V_2^2$

QUADRATURE SIGNAL GENERATION SYSTEM

BACKGROUND OF THE INVENTION

The present invention relates to a quadrature signal generation system, which is used, for example, for generating a pair of carrier signals having precise quadrature relations with each other for quadrature modulation/demodulation, image rejection frequency converter in radio communication.

Figures 15A, 15B:
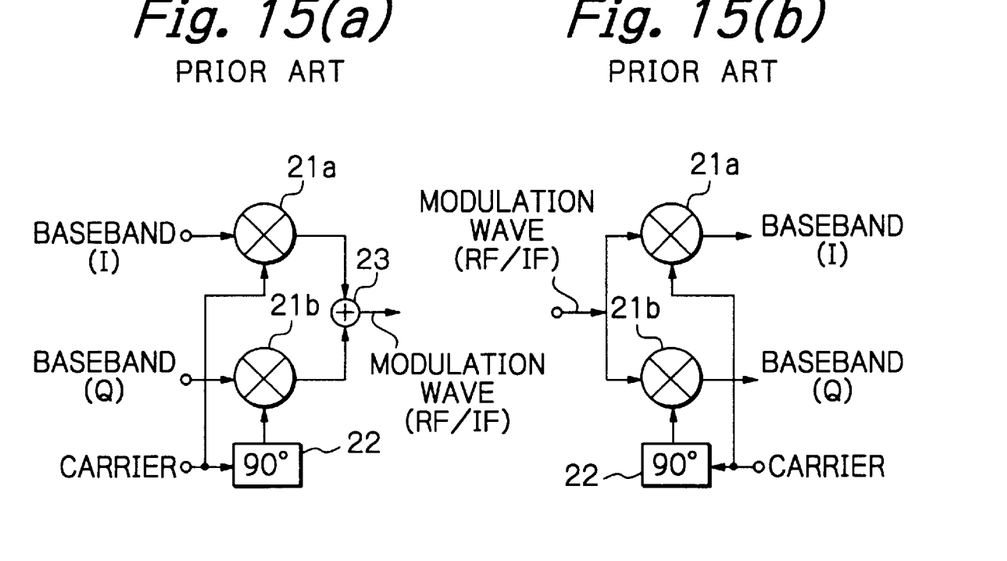
FIG. 15 shows a prior quadrature modulator and a prior quadrature demodulator.

FIG. 15 shows a block diagram of a prior quadrature modulator and a prior quadrature demodulator. A quadrature modulator in FIG. 15(a) comprises a first analog multiplier or a double balanced-mixer (DMB) 21a coupled with a first baseband input (I), a second analog multiplier or a double balanced-mixer (DMB) 21b coupled with a second baseband input (Q), a 90° phase shifter 22 coupled with a carrier input, and an adder 23. A quadrature demodulator in FIG. 15(b) comprises a first analog multiplier or a double-balanced mixer 21a coupled with a first baseband output (I), a second analog multiplier or a double-balanced mixer 21b coupled with a second baseband output (Q), and a 90° phase shifter 22 coupled with a carrier input.

In a quadrature modulator or a quadrature demodulator, a 90° phase shifter must provide a pair of signals having precise quadrature relations, preferably phase error from 90° being less than 1° or 2°, for suppressing interference between I (in-phase) baseband signal and Q (quadrature-phase) baseband signal. Similarly, amplitude error of said pair of signals must be as small as possible, preferably, less than 1% or 2%. Further, in order to suppress an undesirable image signal (a signal separated by an IF frequency from a carrier signal in opposite direction of a desired IF signal) sufficiently in frequency conversion, further precise phase relations and precise amplitude relations (less than 1° and less than 1% for image rejection ratio higher than 40 dB) are requested.

Figure 16:
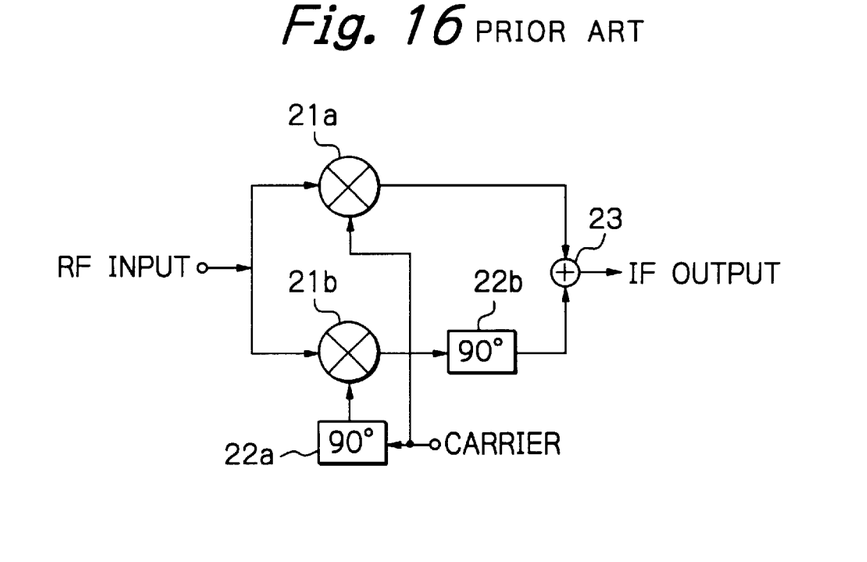
FIG. 16 shows a prior image rejection receiver.

FIG. 16 shows a basic block diagram of a prior image rejection receiver, which comprises analog multipliers or double balanced-mixers 21a, 21b coupled with an RF input, 90° phase shifters 22a and 22b, and an adder 23.

Figure 17:
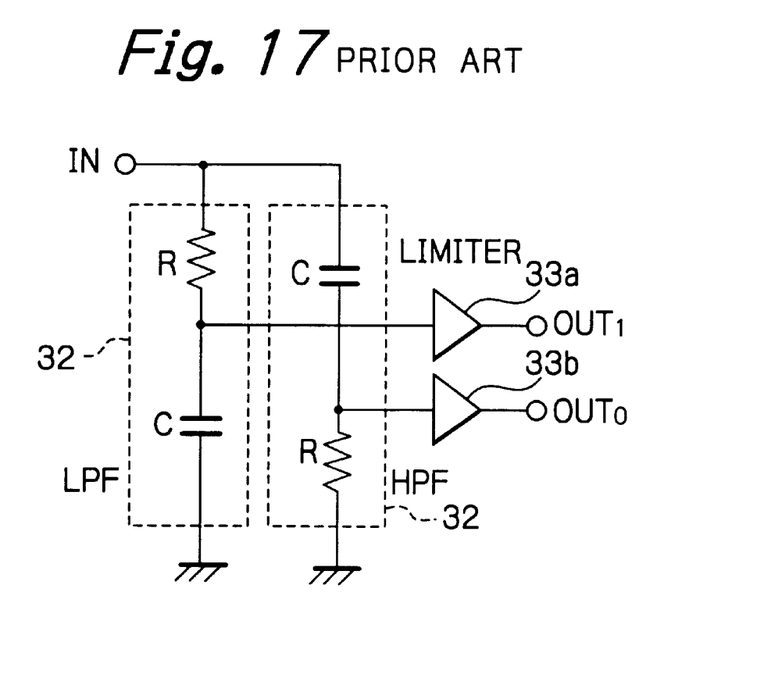
FIG. 17 is a prior RC/CR type 90° phase shifter.
Figure 18:
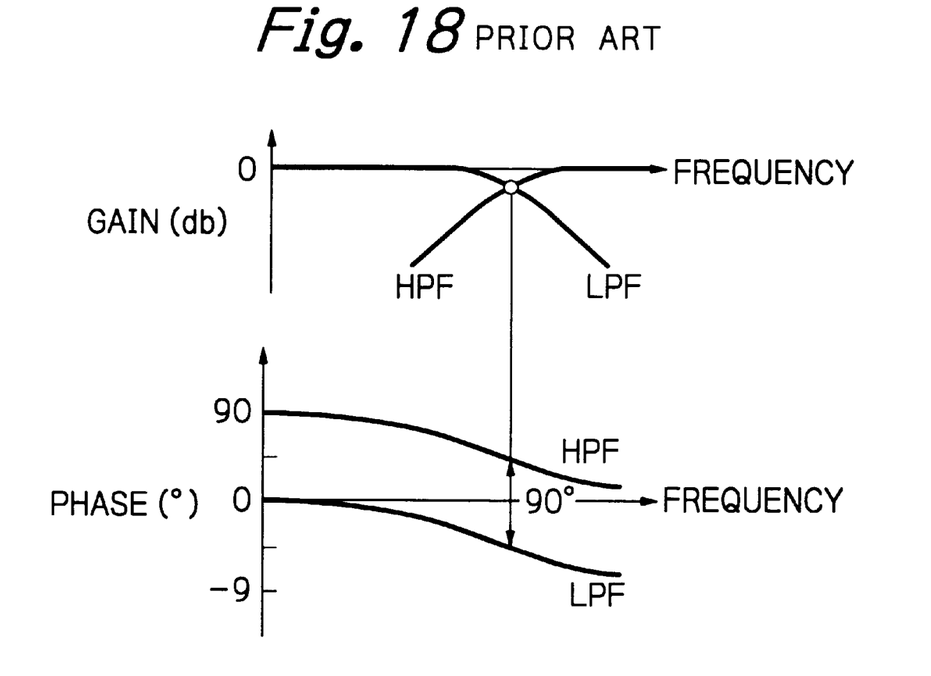
FIG. 18 shows characteristics of a 90° phase shifter of FIG. 17.

FIG. 17 is a circuit diagram of a prior 90° phase shifter using a low pass filter and a high pass filter, and FIG. 18 shows characteristics of a prior low pass filter and a prior high pass filter shown in FIG. 17. As a 90° phase shifter for carrier signals, an RC/CR type phase shifter as shown in FIG. 17 is popularly used. In FIG. 17, numeral 31 is an RC type low pass filter, and numeral 32 is a CR type high pass filter. In FIG. 18, 90° phase difference is kept in whole frequency, and amplitude error is zero at the frequency where $\omega RC=1$ is satisfied.

Figure 19:
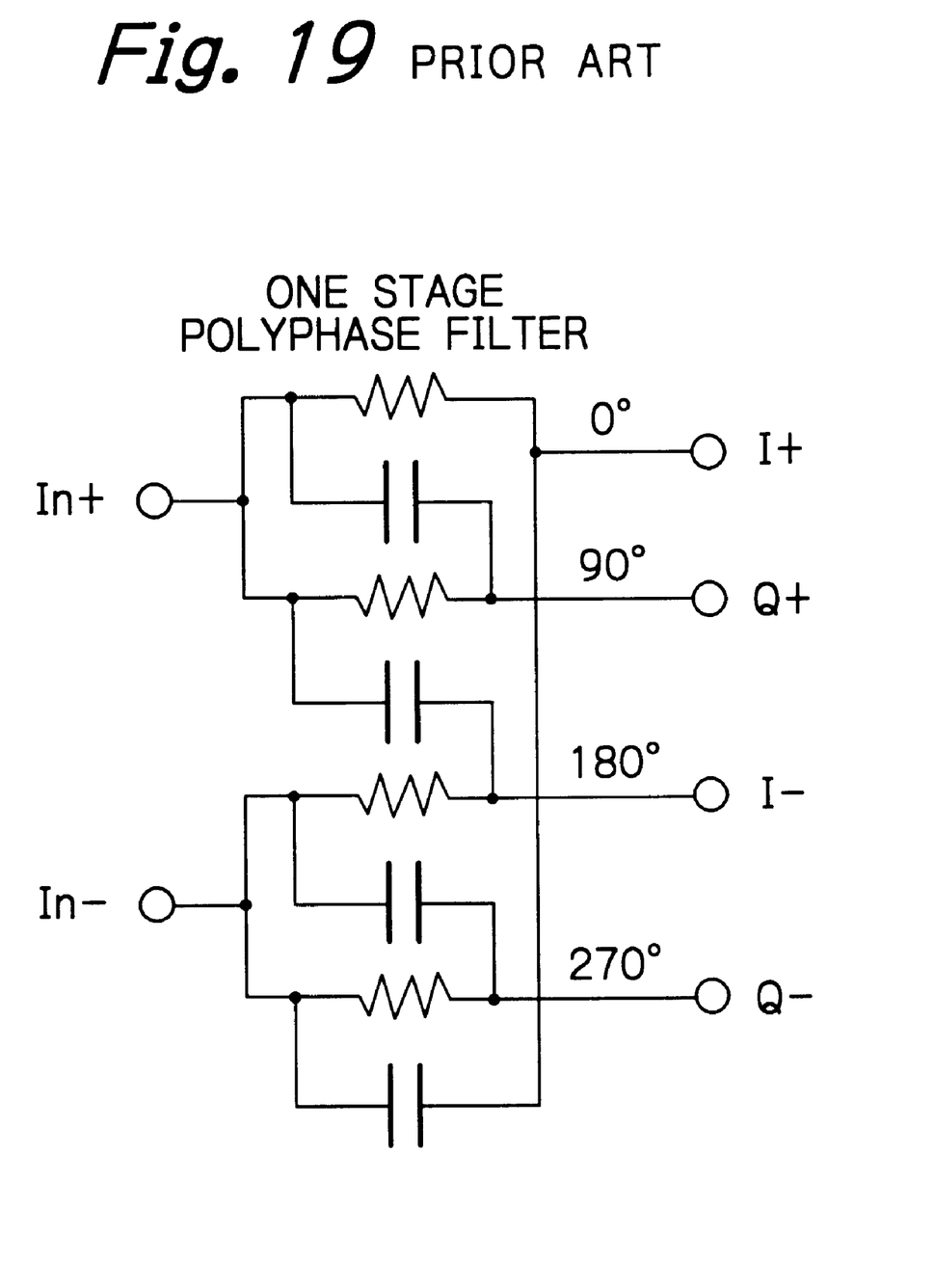
FIG. 19 is another prior 90° phase shifter.

FIG. 19 is another prior phase shifter using one stage poly phase filter constituted by a capacitor C and a resistor R. In FIG. 19, when a pair of differential inputs having phase difference of 180° are applied to input terminals In+ and In−, output terminals I+, Q+, I− and I+ provide phases 0°, 90°, 180° and 270°, respectively. Therefore, for instance by taking I+ and Q+, a 90° phase shifter is obtained.

Figure 20:
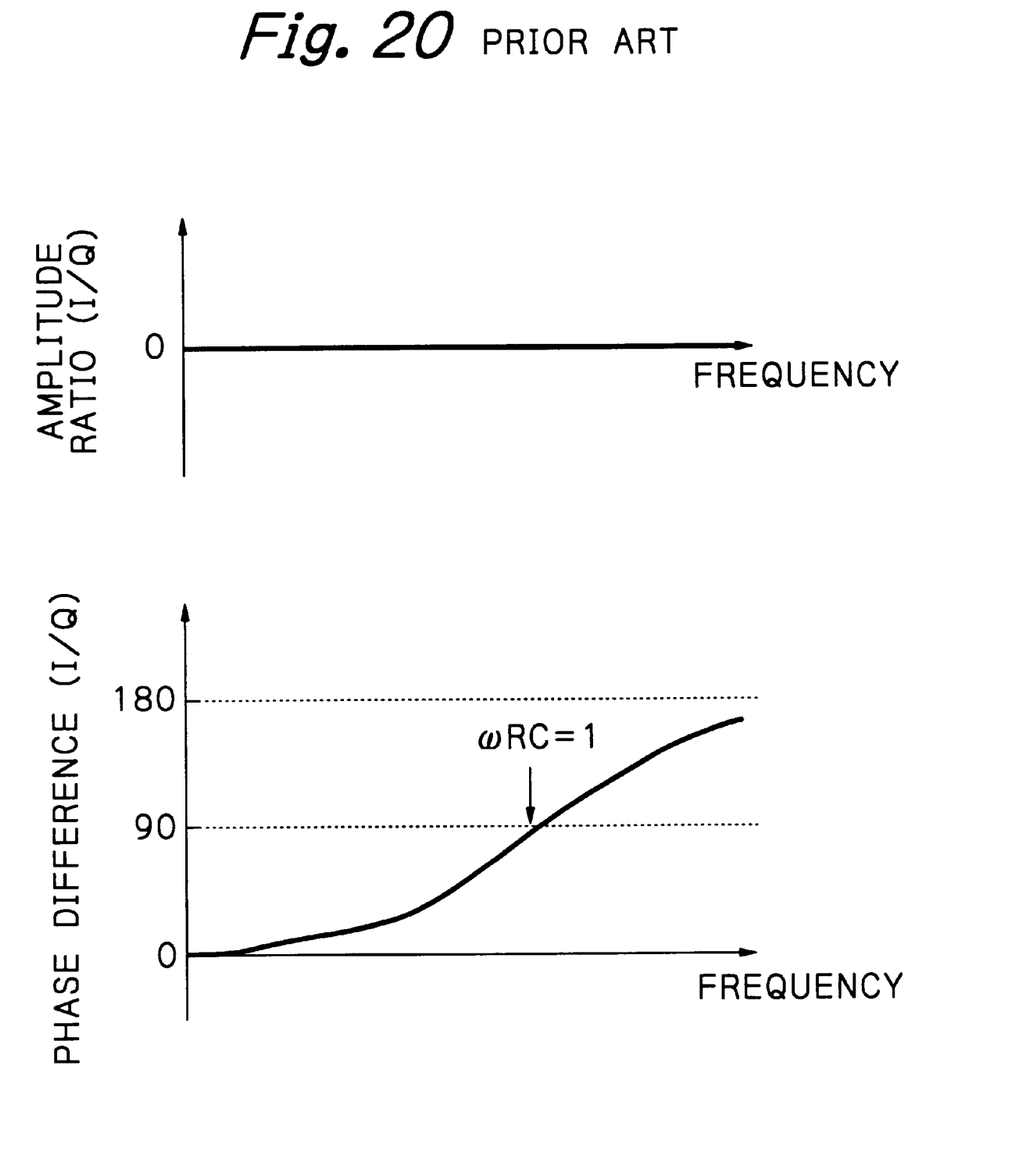
FIG. 20 shows characteristics of a phase shifter of FIG. 19.

FIG. 20 shows frequency characteristics of phase and amplitude of a phase shifter of FIG. 19. As shown in FIG. 20, the frequency characteristics are flat irrespective of frequency, however, 90° phase relation is satisfied only at the frequency $f$ $(=\omega/2\pi)$ $(\omega RC=1)$.

However, the prior arts mentioned above have the disadvantage that phase error is inevitable due to an error of a capacitor and/or a resistor when a circuit is provided by an integrated circuit (IC). That phase error decreases a yield rate of an IC itself. In practice, a phase error around 2° or 3° is inevitable, however, that phase error is not satisfactory for multi-level quadrature modulation such as 16 QAM. In particular, that phase error can not provide an excellent image rejection frequency converter.

In a direct conversion system in which modulation/demodulation is carried out directly at RF frequency, quadrature frequencies are as high as GHz order, and therefore, phase error would be further increased caused by a parasitic effect.

Thus, a prior 90° phase shifter has the disadvantage that a precise 90° phase shifter operating in high frequency is impossible due to an error of components, and/or a parasitic effect.

SUMMARY OF THE INVENTION

It is an object, therefore, to provide a new and improved quadrature signal generation system by overcoming the disadvantages and limitations of a prior quadrature signal generation system.

It is also an object of the present invention to provide a quadrature signal generation system which can operate satisfactory in spite of an error of a component in high frequency.

The above and other objects are attained by a quadrature signal generation system comprising; a pair of input terminals receiving a first A.C. signal and a second A.C. signal, each having a predetermined frequency and phase relation of approximate 90° with each other; a multiplier circuit for providing a product of said first A.C. signal and said second A.C. signal, said product being called a third A.C. signal; a square-difference circuit for providing a difference of a square of the first A.C. signal and a square of the second A.C. signal, said difference called a fourth A.C. signal; the frequency of said third A.C. signal and said fourth A.C. signal being equal to twice of frequency of said first A.C. signal and said second A.C. signal, and said third A.C. signal and said fourth A.C. signal having fine phase relation of 90° with each other.

Preferably, a 6 dB amplifier coupled with an output of said multiplier is provided.

Preferably, a pair of 3 dB amplifiers coupled with each inputs of said multiplier are provided.

Still preferably, said multiplier is implemented by using a Gilbert cell type transistor circuit.

Still preferably, said square-difference circuit comprises an adder for providing a sum of said first A.C. signal and said second A.C. signal, a subtractor for providing a difference between said first A.C. signal and said second A.C. signal, and a second multiplier for providing a product of an output of said adder and said subtractor.

Still preferably, said multiplier comprises an adder for providing a sum of said first A.C. signal and said second A.C. signal, a subtractor for providing a difference between said first A.C. signal and said second A.C. signal, a second square-difference circuit for providing a difference between a square of an output of said adder and a square of an output of said subtractor.

Still preferably, a series circuit of a capacitor and a limiter amplifier is provided at an output of said multiplier and an output of said square-difference circuit.

Still preferably, a phase shifter is provided for accepting an input signal having a predetermined frequency and providing said first A.C. signal and said second A.C. signal having phase relation of 90° with each other.

The present invention further provides a method for generating signals having quadrature phase relation with each other comprising the steps of; multiplying a first A.C. signal and a second A.C. signal each having a predetermined frequency and having phase relation of approximate 90° with each other, and providing a third A.C. signal; and providing a difference between a square of said first A.C. signal and a square of said second A.C. signal, as a fourth A.C. signal which has the same frequency as that of the third A.C. signal, and the phase relation of 90° from that of the third A.C. signal.

BRIEF DESCRIPTION OF THE DRAWINGS

The foregoing and other objects, feature, and attendant advantages of the present invention will be appreciated as the same become better understood by means of the following description and accompanying drawings wherein.

DESCRIPTION OF THE PREFERRED EMBODIMENTS (First Embodiment)

Figure 1:
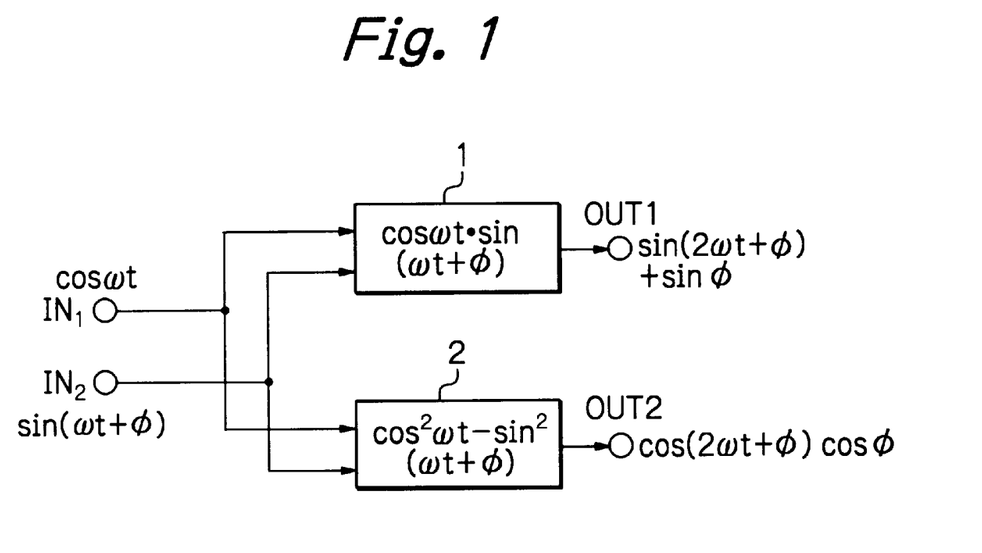
FIG. 1 is a block diagram of a quadrature signal generation system according to the present invention.

FIG. 1 shows a first embodiment of the present invention which has a multiplier 1 and a square-difference circuit 2. In the embodiment, it is assumed that a pair of input signals cos ωt, and sig(ωt+φ) have approximate 90° phase relation. The symbol φ shows a phase difference from 90°, or a phase error. The embodiment of FIG. 1 relies upon the following two equations.

$$\cos\omega t \sin(\omega t+\phi)=(\tfrac{1}{2})\sin(2\omega t+\phi)+(\tfrac{1}{2})\sin\phi \quad (1)$$

$$\cos^2\omega t-\sin^2(\omega t+\phi)=\cos(2\omega t+\phi)\cos\phi \quad (2)$$

It should be appreciated in the equations (1) and (2) that although input signals have a phase error by φ, output signals (first terms of each equations) which have frequency doubling keep accurate and precise phase relation by 90° with each other.

The second term $(\tfrac{1}{2})\sin\phi$ of the equation (1) is D.C. offset caused by a phase error, and can be removed by an A.C. coupling by using a capacitor as described later.

The coefficient cos φ in the equation (2) caused by a phase error causes an amplitude error. By the way, when the phase error φ is small, $\cos\phi\approx1-(\tfrac{1}{2})\phi^2$ is satisfied. It is a secondary order error and is decreased. Assuming that φ=5+=0.087 rad, cos φ=0.0062, thus, the amplitude error is 0.4% which is small sufficiently. Further, that amplitude error can be absorbed by using a limiter amplifier.

As the equation (1) has the coefficient (½), the following equation which multiplies both sides by 2 is desirable.

$$2\cos\omega t\sin(\omega t + \phi) = 2^{1/2}\cos\omega t\, 2^{1/2}\sin(\omega t + \phi) = \sin(2\omega t + \phi) + \sin\phi \quad (3)$$

Figure 2:
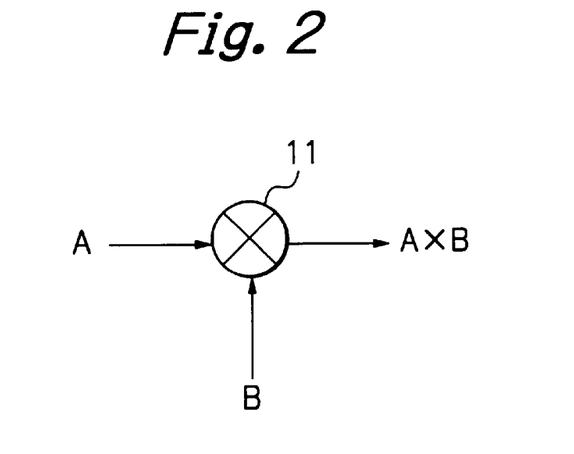
FIG. 2 is a basic multiplier.
Figure 3:
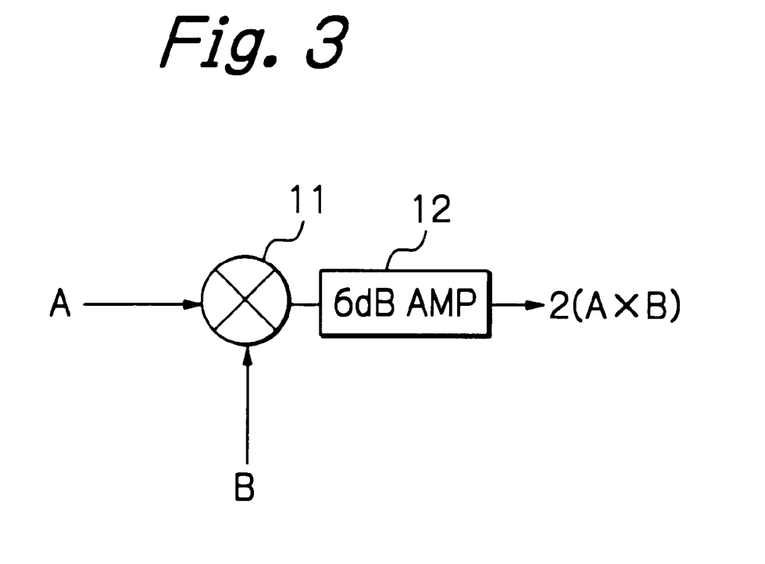
FIG. 3 is a multiplier having a 6 dB amplifier.
Figure 4:
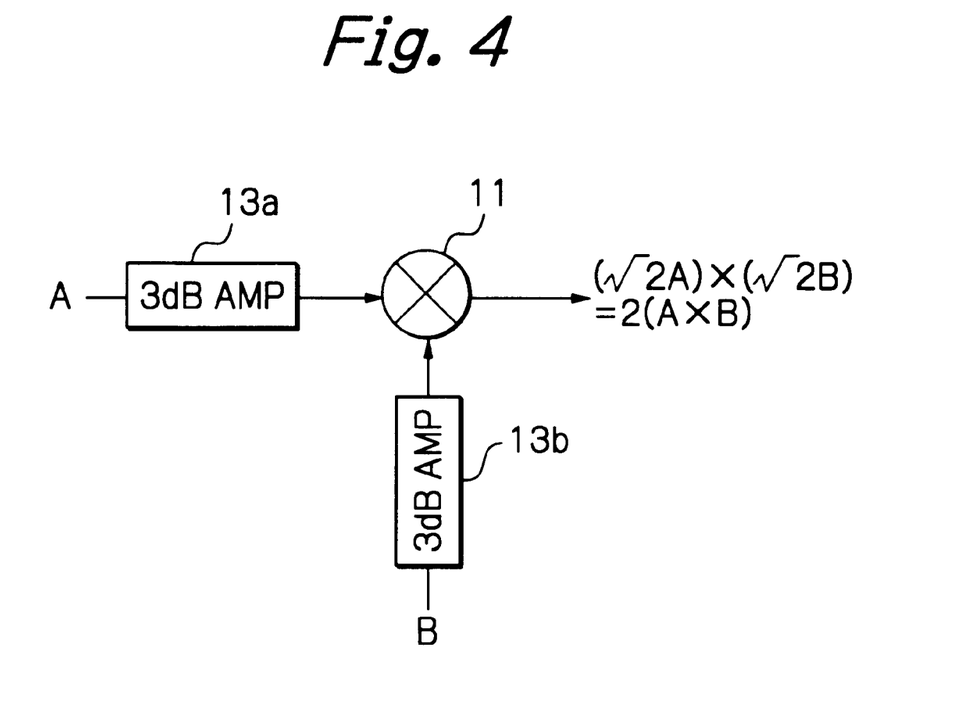
FIG. 4 is a multiplier having a pair of 3 dB amplifiers.

FIGS. 2, 3 and 4 show a multiplier 1 for the equation (1). FIG. 2 is a basic structure using a multiplier, FIG. 3 has a 6 dB amplifier 12 in an output of a multiplier 11, FIG. 4 has a pair of 3 dB amplifiers 13a and 13b in inputs of a multiplier 11.

Figure 5:
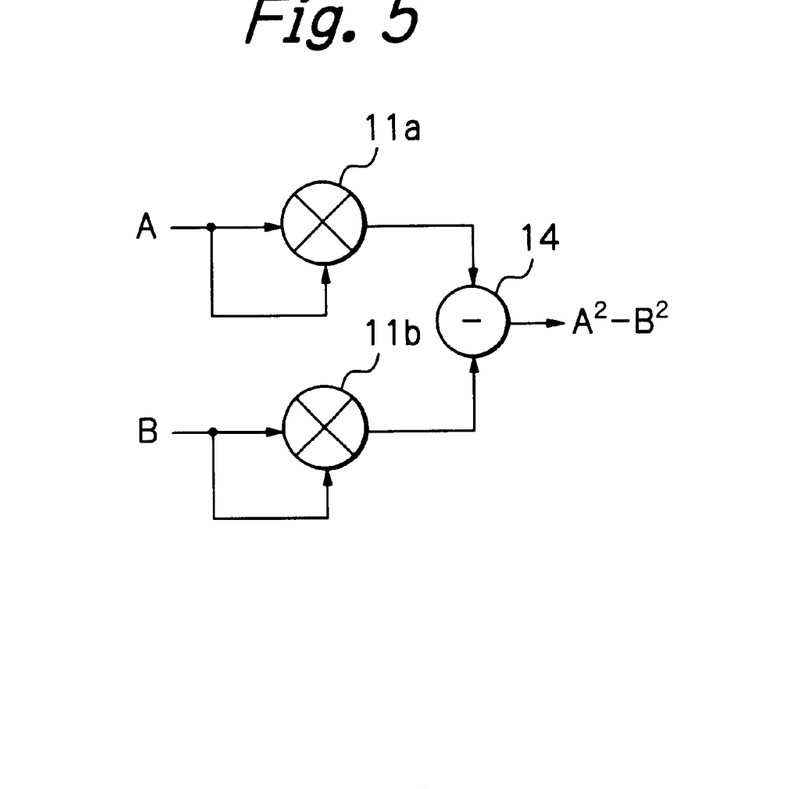
FIG. 5 is a basic square-difference circuit.
Figure 6:
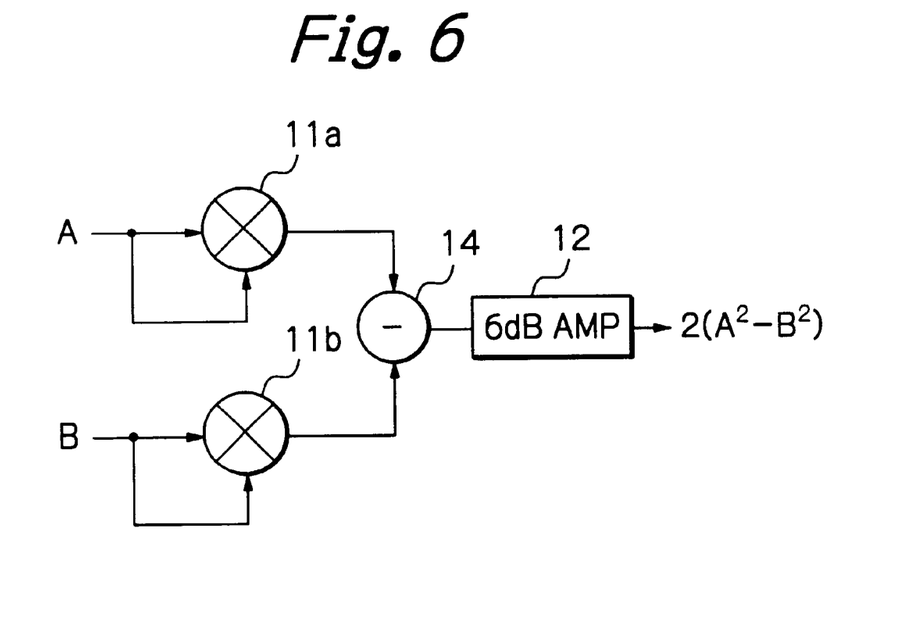
FIG. 6 is a square-difference circuit having a 6 dB amplifier.
Figure 7:
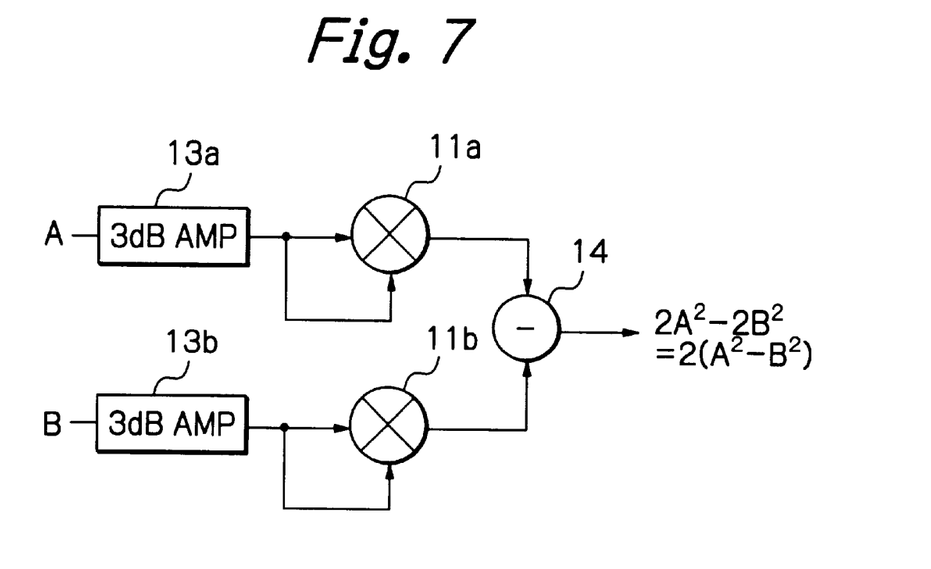
FIG. 7 is a square-difference circuit having a pair of 3 dB amplifiers.

A square-difference circuit 2 may be implemented, as shown in FIGS. 5, 6 and 7, by a pair of multipliers 11a and 11b and a subtractor 14 (FIG. 5). Further, a 6 dB amplifier 12 may be inserted in an output of the subtractor 14 (FIG. 6), or a pair of 3 dB amplifiers may be inserted in inputs of the multipliers (FIG. 7).

Now, the analysis when input quadrature signals have an amplitude error (a), is described in accordance with the equation (3). It is assumed that the phase error ω is zero for the sake of simplicity of explanation.

$$2\cos\omega t\cdot(1+a)\sin\omega t=(1+a)\sin 2\omega t \quad (4)$$

$$\cos^2\omega t-(1+a)^2\sin^2\omega t=(1+a+a^2/2)\cos 2\omega t+a(1+a/2) \quad (5)$$

As the coefficient of the right side of the equation (4) is (1+a), the amplitude error is $a^2/2$ in the first term in the right side of the equation (5), thus, the amplitude error is considerably decreased. Assuming that the amplitude error a=0.05 (=5%), $a^2/2=0.00125$ (=0.125%) which is small sufficiently. Further, that small error can be absorbed by using a limiter amplifier as described later. The second term in the equation (5) is a D.C. offset, which can be removed by using an A.C. coupling by a capacitor as described later.

As described above in detail, the phase error in input quadrature signals is converted into a D.C. offset, and a decreased amplitude error which is of secondary order, and the amplitude error in input quadrature signals is converted to a decreased amplitude error of a secondary order and a D.C. offset. Thus, according to the present invention which doubles an input frequency, the phase error of the output quadrature signals is zero, and the amplitude error of the same is considerably decreased.

Figure 8:
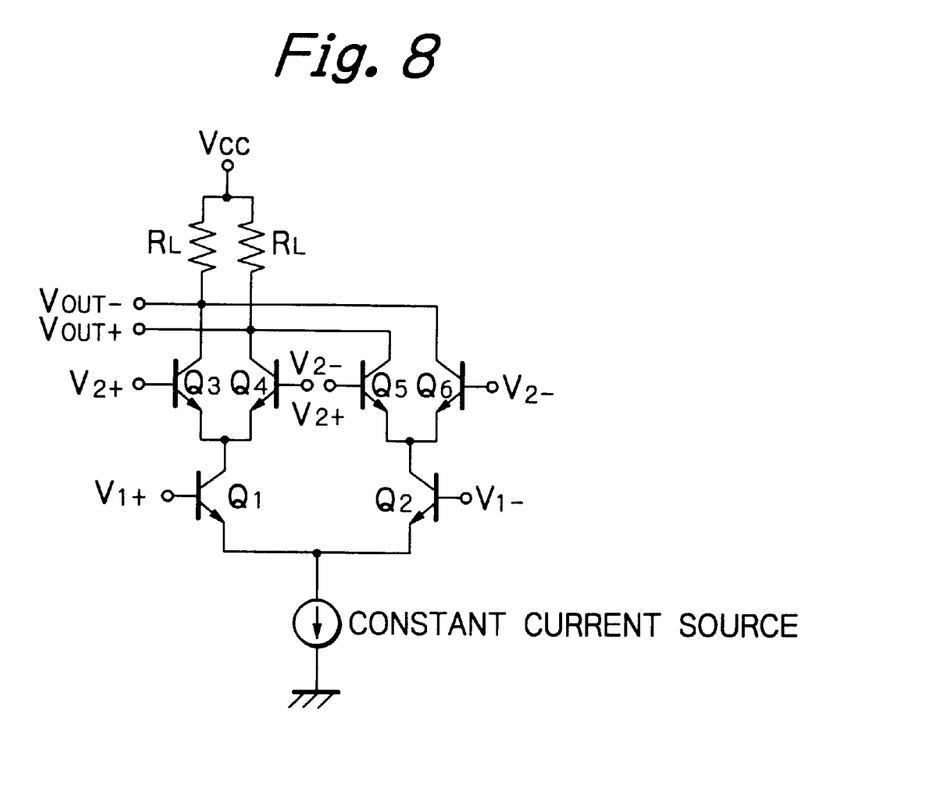
FIG. 8 is a circuit diagram of a Gilbert cell type multiplier implemented by using bipolar transistors.
Figure 9:
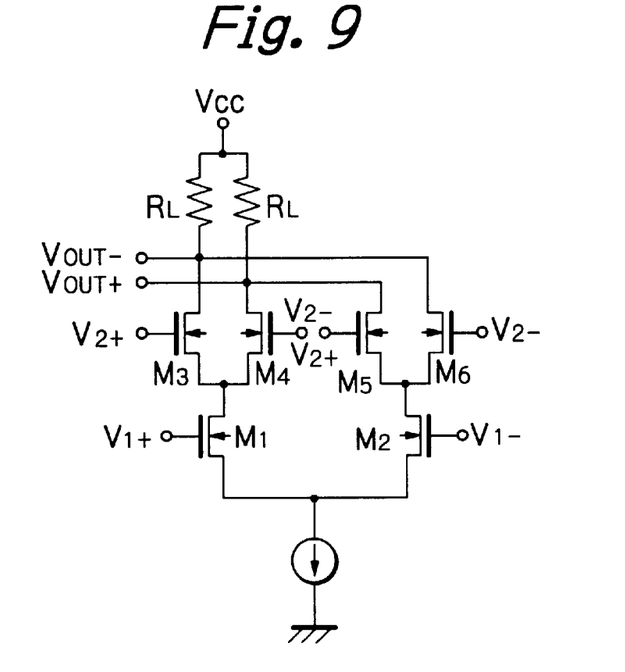
FIG. 9 is a circuit diagram of a Gilbert cell type multiplier implemented by using MOS transistors.

A multiplier may be implemented by a Gilbert cell type circuit using a transistor as shown in FIGS. 8 and 9. When a pair of input signals (V1, V2) are applied to transistors Q1 through Q6 in differential form (V1+, V1−) or (V2+, V2−), the product Vout of V1 and V2 is obtained in differential form ($V_{out}$+, $V_{out}$−).

Figure 10:
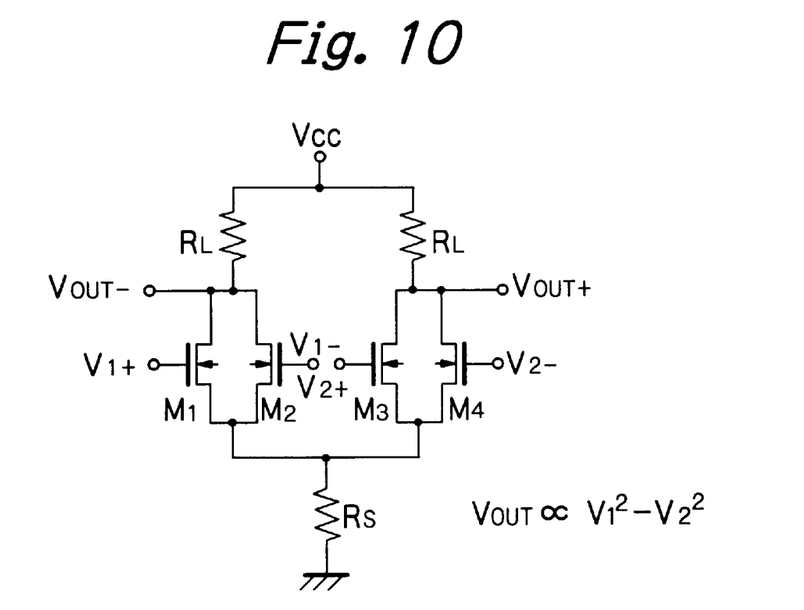
FIG. 10 is a circuit diagram of another square-difference circuit implemented by using MOS transistors.
Figure 11:
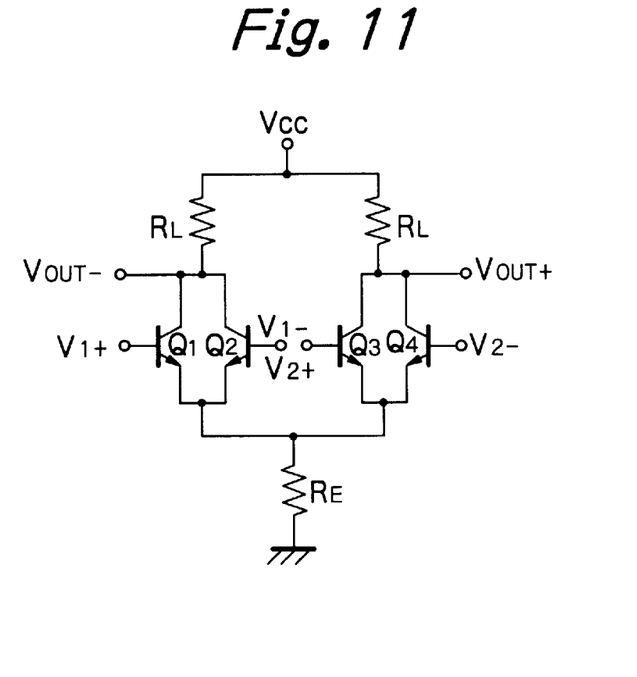
FIG. 11 is a circuit diagram of another square-difference circuit implemented by using bipolar transistors.

A square-difference circuit may be implemented with no multiplier as shown in FIG. 10 having MOS transistors (Reference; J. S. Pena-Finol and J. A. Connelly, "A MOS Four-Quadrant analog Multiplier Using the Quarter-Square Technique", J.Solid-State Circuits, Vol.SC-22, No.6, pages 1064–1073, December 1987). This structure may further be implemented by using bipolar transistors as shown in FIG. 11.

A pair of input quadrature signals may be supplied either by an external circuit, or an inner simple phase shift circuit, as shown in FIG. 17 or FIG. 19. In FIG. 17, phase difference of 90° is obtained in wide frequency range, while amplitudes of a pair of outputs coincide with each other on the only frequency satisfying $\omega RC=1$. On the other hand, in FIG. 19 which is one stage poly-phase filter, amplitudes of a pair of outputs coincide with each other in wide frequency range, but phase shift of 90° is obtained on the frequency satisfying $\omega RC=1$. As the phase error from 90° of the input quadrature signals does not affect to the quadrature characteristics of output signals in the present invention, the circuit of FIG. 19 may provide fine quadrature output signals in wide frequency range.

It should be noted that output frequency in the present invention is twice as high as that of input frequency, input frequency must be half of desired output frequency.

(Second Embodiment)

Figure 12:
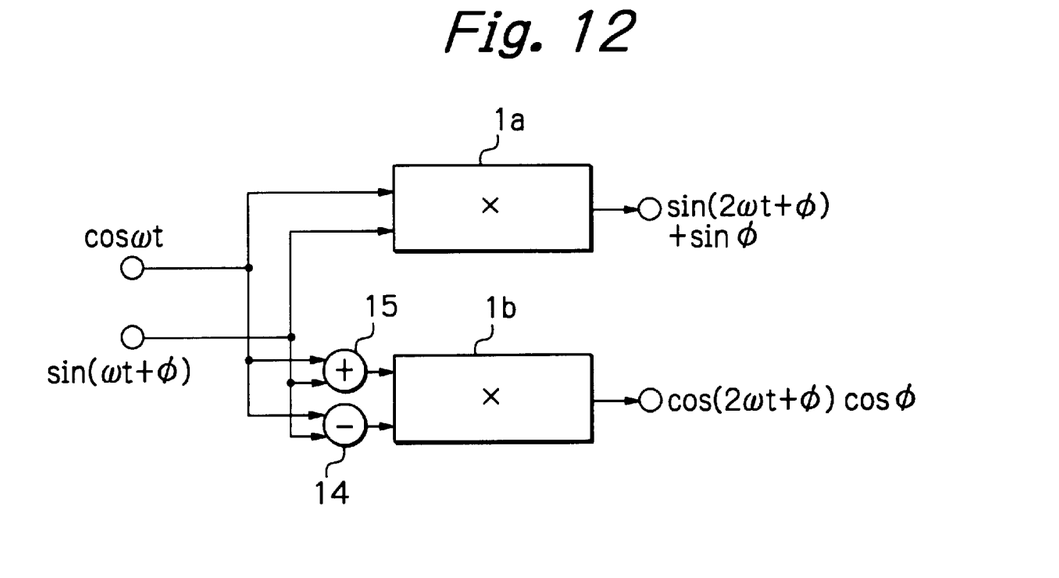
FIG. 12 is another embodiment of a quadrature signal generator according to the present invention.

FIG. 12 shows a second embodiment for providing quadrature signals according to the present invention. The circuit of FIG. 12 comprises multiplier $1a$ and $1b$, a subtractor 14, and an adder 15. In the current embodiment, the first output is obtained according to the equation (1) or the equation (3), and the other output is obtained by the following equation (6) which is changed from the equation (2).

$$\cos^2\omega t - \sin^2(\omega t + \phi) = [\cos\omega t + \sin(\omega t + \phi)][\cos\omega t - \sin(\omega t + \phi)] = \cos(2\omega t + \phi)\cos\phi \quad (6)$$

The equation (6) shows that the multiplication of the sum and the difference of the input quadrature signals is equivalent to the square-difference of the first embodiment. In the second embodiment, both the outputs are provided by using a pair of multipliers, thus, the delay of outputs is the same as each other, and therefore, it is advantageous to use in high frequency region. The second embodiment has the similar improvement for phase error and/or amplitude error of input signals to that of the first embodiment.

(Third Embodiment)

Figure 13:
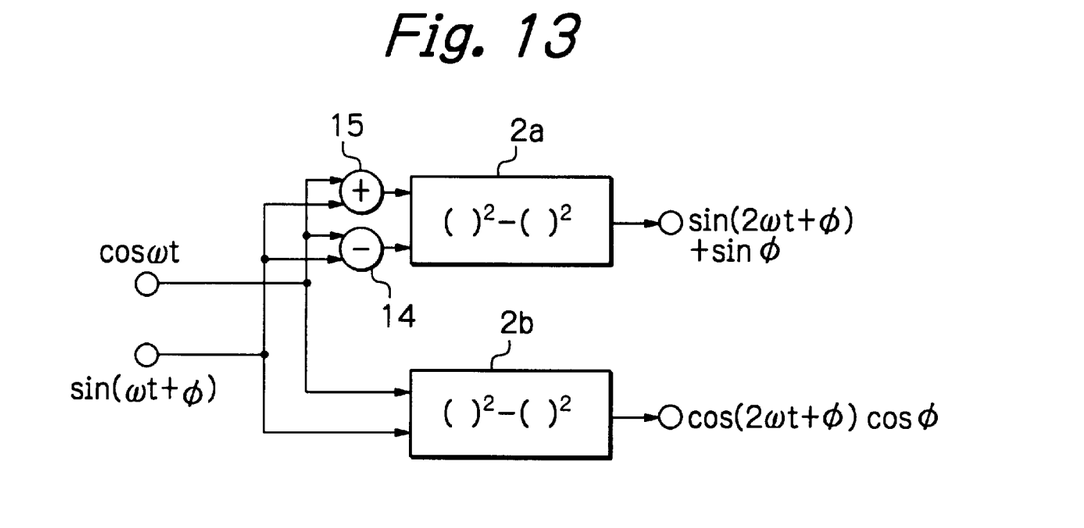
FIG. 13 is still another embodiment of a quadrature signal generator according to the present invention.

FIG. 13 shows the third embodiment of the present invention. The quadrature signal generation system in FIG. 13 comprises a pair of square-difference circuits $2a$ and $2b$, a subtractor 14 and an adder 15. In the current embodiment, the equation (7) is obtained by changing the equation (1) by multiplying by 4, and the equation (8) is obtained by changing the equation (2) by multiplying by 2.

$$4\cos\omega t \cdot \sin(\omega t + \phi) = [\cos\omega t + \sin(\omega t + \phi)]^2 - [\cos\omega t - \sin(\omega t + \phi)]^2 = 2\sin(2\omega t + \phi) + 2\sin\phi \quad (7)$$

$$2[\cos^2\omega t - \sin^2(\omega t + \phi)] = 2\cos(2\omega t + \phi)\cos\phi \quad (8)$$

The equation (7) shows that the square-difference circuit $2a$ provides a product of input signals by the square difference of a sum and a difference of input signals. The equation (8) is implemented by a square-difference circuit shown in FIGS. 6 and 7. In this embodiment, a multiplier operation is implemented by using a square-difference circuit, thus, both the outputs are obtained by using a square-difference circuit, therefore, it is advantageous to use in high frequency region. The third embodiment has the similar improvement for phase error and/or amplitude error of input signals to that of the first embodiment.

(Fourth Embodiment)

Figure 14:
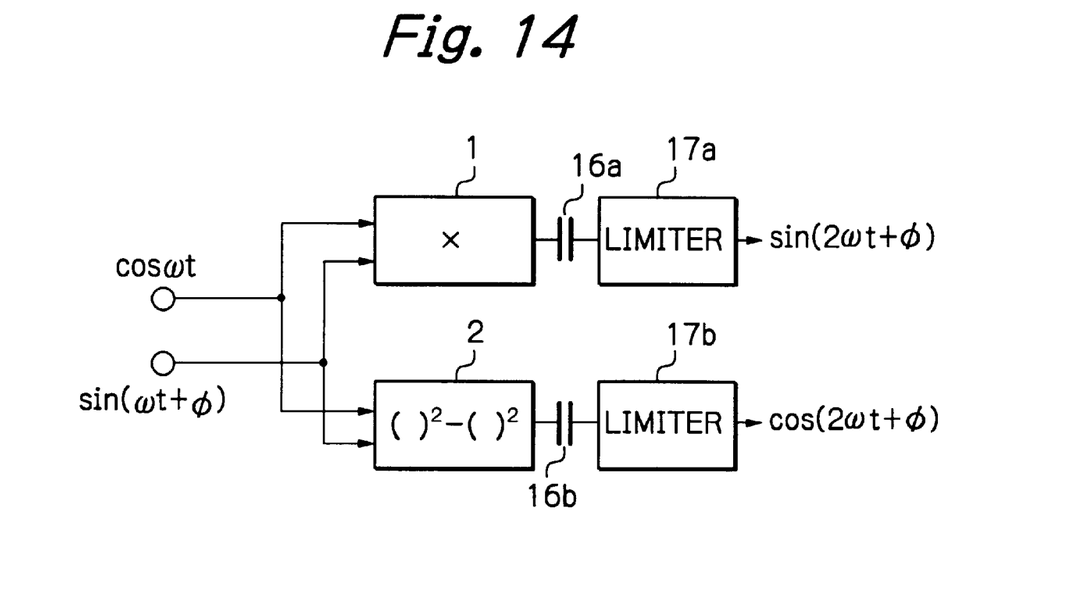
FIG. 14 is still another embodiment of a quadrature signal generator according to the present invention.

FIG. 14 shows fourth embodiment according to the present invention. In FIG. 14, a quadrature signal generation system comprises a multiplier 1, a square-difference circuit 2, capacitors $16a$ and $16b$, and limiter amplifiers $17a$ and $17b$. FIG. 14 is the modification of FIG. 1, and further has a series capacitor ($16a$, $17a$) and a limiter amplifier ($16b$, $17b$) in each outputs of FIG. 1. Even when a multiplier of FIG. 2 which provides amplitude error by 6 dB between each outputs is used, the configuration of FIG. 14 provides no amplitude error between each outputs, because of the use of a limiter amplifier. Further, an amplitude error of outputs caused by phase error and/or amplitude error in input quadrature signals can be removed by the use of a limiter amplifier.

It should be noted of course that a series capacitor and a limiter amplifier in FIG. 14 may be coupled with the second embodiment and the third embodiment so that the similar effects to that of the fourth embodiment are obtained in the second embodiment and the third embodiment.

As described above in detail, even when coarse quadrature input signals are used, fine quadrature signals having double frequency with accurate phase relation and amplitude relation are obtained.

From the foregoing, it will now be apparent that a new and improved quadrature signal generation system has been found. It should be appreciated of course that the embodiments disclosed are merely illustrative and are not intended to limit the scope of the invention. Reference should be made, therefore, to the appended claims to indicate the scope of the invention.

What is claimed is:

1. A quadrature signal generation system comprising;
   a pair of input terminals receiving a first A.C. signal and a second A.C. signal, each having a predetermined frequency and phase relation of approximate 90° with each other,
   a multiplier circuit for providing a product of said first A.C. signal and said second A.C. signal, said product being called a third A.C. signal,
   a square-difference circuit for providing a difference of a square of the first A.C. signal and a square of the second A.C. signal, said difference called a fourth A.C. signal,
   the frequency of said third A.C. signal and said fourth A.C. signal being equal to twice of frequency of said first A.C. signal and said second A.C. signal, and said third A.C. signal and said fourth A.C. signal having fine phase relation of 90° with each other.

2. A quadrature signal generation system according to claim 1, further comprising a 6 dB amplifier coupled with an output of said multiplier.

3. A quadrature signal generation system according to claim 1, further comprising a pair of 3 dB amplifiers coupled with each inputs of said multiplier.

4. A quadrature signal generation system according to claim 1, wherein said multiplier is implemented by using a Gilbert cell type transistor circuit.

5. A quadrature signal generation system according to claim 1, further comprising a series circuit of a capacitor and a limiter amplifier at an output of said multiplier and an output of said square-difference circuit.

6. A quadrature signal generation system according to claim 1, further comprising a phase shifter which accepts an input signal having a predetermined frequency and provides said first A.C. signal and said second A.C. signal having phase relation of 90° with each other.

7. A quadrature signal generation system comprising:
- a pair of input terminals receiving a first A.C. signal and a second A.C. signal, each having a predetermined frequency and phase relation of approximate 90° with each other,
- a first multiplier circuit for providing a first product of said first A.C. signal and said second A.C. signal, said first product being called a third A.C. signal,
- an adder for providing a sum of said first A.C. signal and said second A.C. signal,
- a subtractor for providing a difference between said first A.C. signal and said second A.C. signal, and
- a second multiplier for providing a second product of an output of said adder and said subtractor, said second product being called a fourth A.C. signal,
- wherein the frequency of said third A.C. signal and said fourth A.C. signal being equal to twice of frequency of said first A.C. signal and said second A.C. signal, and said third A.C. signal and said fourth A.C. signal having fine phase relation of 90° with each other.

8. A quadrature signal generation system comprising:
- a pair of input terminals receiving a first A.C. signal and a second A.C. signal, each having a predetermined frequency and phase relation of approximately 90° with each other,
- an adder for providing a sum of said first A.C. signal and said second A.C. signal,
- a subtractor for providing a difference between said first A.C. signal and said second A.C. signal,
- a first square-difference circuit for providing a first difference between a square of an output of said adder and a square of an output of said subtractor, said first difference being called a third A.C. signal,
- a second square-difference circuit for providing a difference of a square of the first A.C. signal and a square of the second A.C. signal, said second difference called a fourth A.C. signal,
- wherein the frequency of said third A.C. signal and said fourth A.C. signal being equal to twice of frequency of said first A.C. signal and said second A.C. signal, and said third A.C. signal and said fourth A.C. signal having fine phase relation of 90° with each other.

9. A method for generating signals having quadrature phase relation with each other comprising the steps of;
- multiplying a first A.C. signal and a second A.C. signal each having a predetermined frequency and having phase relation of approximate 90° with each other, and providing a third A.C. signal,
- providing a difference between a square of said first A.C. signal and a square of said second A.C. signal, as a fourth A.C. signal which has the same frequency as that of the third A.C. signal, and the phase relation of 90° from that of the third A.C. signal.

* * * * *